United States Patent [19]

Minnema et al.

[11] Patent Number: 4,661,435

[45] Date of Patent: Apr. 28, 1987

[54] PHOTOSENSITIVE POLYAMIC ACID DERIVATIVE, COMPOUNDS USED IN THE MANUFACTURE OF THE DERIVATIVE, METHOD OF MANUFACTURING POLYIMIDE PATTERN ON A SUBSTRATE, AND SEMICONDUCTOR DEVICE COMPRISING A POLYIMIDE PATTERN OBTAINED BY USING THE SAID METHOD

[75] Inventors: Lourens Minnema; Johan M. van der Zande, both of Eindhoven, Netherlands

[73] Assignee: U.S. Philips Corporation, New York, N.Y.

[21] Appl. No.: 828,093

[22] Filed: Feb. 10, 1986

Related U.S. Application Data

[63] Continuation of Ser. No. 626,273, Jun. 29, 1984, abandoned.

[30] Foreign Application Priority Data

Jul. 1, 1983 [NL] Netherlands ......................... 8302338

[51] Int. Cl.[4] ........................... G03C 5/16; G03F 7/26
[52] U.S. Cl. .................................... 430/311; 430/283; 430/286; 430/330; 430/327; 430/18

[58] Field of Search ............... 430/283, 286, 330, 311, 430/18, 327; 525/426

[56]  References Cited

U.S. PATENT DOCUMENTS 4,158,731  6/1979  Baumann et al. ............... 430/283 X
4,292,398  9/1981  Rubner et al. .................. 430/287 X
4,329,419  5/1982  Goff et al. ........................... 430/283

OTHER PUBLICATIONS

Roland Rubner, "Production of Highly Heat-Resistant Film Patterns from Photoreactive Polymeric Precursors, Part 1, General Principle" Siemens Forsch.-u. Entwickl. Ber. Bd. 5(1976), No. 2, pp. 92-97.

Primary Examiner—John E. Kittle
Assistant Examiner—Cynthia Hamilton
Attorney, Agent, or Firm—Norman N. Spain

[57] ABSTRACT

A photosensitive polyamic acid derivative, compounds used in the manufacture of the derivative, method of manufacturing a polyimide pattern on a substrate, and semiconductor device comprising a polyimide pattern obtained by using the said method.

3 Claims, No Drawings

PHOTOSENSITIVE POLYAMIC ACID DERIVATIVE, COMPOUNDS USED IN THE MANUFACTURE OF THE DERIVATIVE, METHOD OF MANUFACTURING POLYIMIDE PATTERN ON A SUBSTRATE, AND SEMICONDUCTOR DEVICE COMPRISING A POLYIMIDE PATTERN OBTAINED BY USING THE SAID METHOD

This is a continuation of application Ser. No. 626,273, filed June 29, 1984 now abandoned.

The invention relates to a new photosensitive polyamic acid derivative which can be converted into a polyimide by means of a thermal treatment. This process is termed an imidisation process.

Polyimide is used inter alia in semiconductor technology as, for example, a dielectric layer for multilayer wiring. Polyimide is also used as a thin film in, for example, displays, hybrid circuits, and as a mask for ion implantation. The necessity frequently presents itself of providing a pattern in the film or in the layer of polyimide.

A conventional method consists in that a layer of polyamic acid i.e. the prepolymer of polyimide, is covered with a positive photoresist, the resist layer is exposed to light pattern-wise and is then developed, the exposed parts of the layer of the polyamic acid are dissolved and the remaining polyamic acid is imidised.

According to another very interesting method with which the technology of the formation of polyimide pattern is considerably simplified, a photosensitive polyamic acid derivative is used, hence a modified polyamic acid. Such a derivative may be used as a negative resist. A layer of the polyamic acid derivative is exposed to light pattern-wise in which a cross-linking or polymerisation takes place in the exposed places. The layer is developed, the non-exposed parts of the layer dissolving. The polyamic acid derivative in the remaining parts of the layer is converted into polyimide by a thermal threatment.

In a recent publication in Organic Coatings and Applied Polymer Science Proceedings, Vol. 48, pp. 70.75 (March, 1983) a photosensitive polyimide siloxane prepolymer is described which is modified with the photosensitive isocyanato-ethyl methacrylate. The polyimide siloxane prepolymer is a block polymer of benzophenone dianhydride (70%) and 1,3-bis-γ-aminopropyltetramethyl disiloxane (30%) which has been reacted with isocyanato-ethyl methacrylate. The disadvantage of this known photosensitive polymer is that the preparation thereof occurs very slowly. A catalysis of the reaction with amines has for its result that water is formed which can react with the isocyanate reagent and then promotes gelation. A catalysis with tin compounds has for its disadvantage that the electrical properties of the ultimate polyimide are impaired. Moreover, the isocyanate reagent is detrimental to health.

The cross-linking of this known photosensitive prepolymer under the influence of, for example, ultraviolet light, also occurs very slowly. In addition to light, heat is also necessary to achieve the cross-linking.

It is the object of the invention to provide a photosensitive polyamic acid derivative which, at normal ambient temperature is efficaciously cross-linked under the influence of light, for example, ultraviolet light.

Another object is to manufacture a polyamic acid derivative without using any detrimental or poisonous reagents.

A further object is to provide a photosensitive polyamic acid derivative which can also be manufactured easily without catalysts.

According to the invention these objects are achieved by means of a new photosensitive polyamic acid derivative which is obtained by treating polyamic acid with a compound of formula I

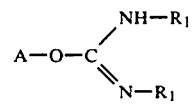

in which formulae
A is a group according to formula II

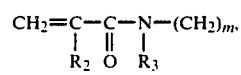

III

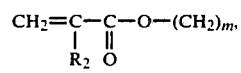

IV

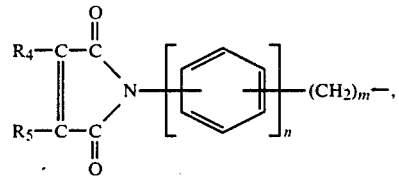

or IV A

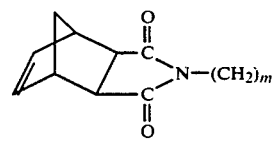

$R_1$ is an alkyl group having 1–8 carbon atoms,
$R_2$ is a hydrogen atom or a methyl group,
$R_3$ is a hydrogen atom or an alkyl group having 1–4 carbon atoms,
$R_4$ and $R_5$ are equal or different and each represent a hydrogen atom, a methyl group or a phenyl group,
m has a value from 1–6, and
n has the value 0 or 1.

The term "alkyl group" is to be understood to include straight, branched and cyclic alkyl groups.

The reaction is carried out at normal ambient temperature preferably in the presence of organic solvents. Examples of suitable solvents are ethers, for example, ethylene glycol dimethyl ether, amides, for example, dimethylacetamide, alcohols, for example, methanol, and heterocyclic solvents, for example, N-methylpyrrolidone.

The quantity of the compound of formula I to be added to the polyamic acid is not restricted to narrow limits. The quantity of compound of formula I is, for example, 10–100% of the stoichiometric (equivalent) quantity.

The polyamic acid starting product is a known substance which is shown by formula IX

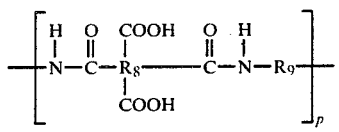

in which formula
$R_8$ is a tetravalent group selected from the groups represented by formulae X

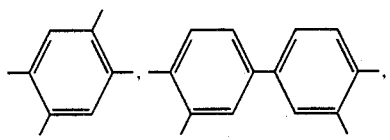

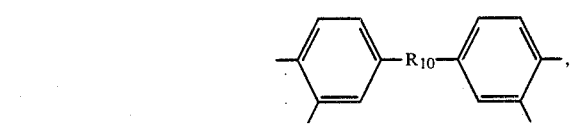

wherein
$R_{10}$ is a bivalent group selected from the groups represented by formulae XI

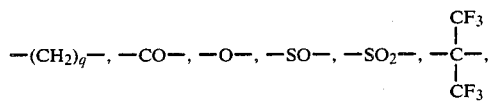

wherein $q = 1-4$,
$R_9$ is a bivalent group represented from the groups represented by formulae XIII

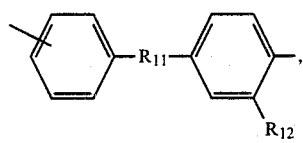

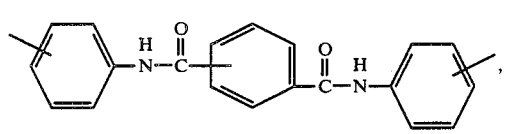

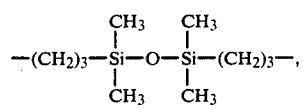

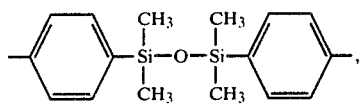

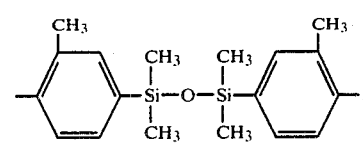

wherein
$R_{11}$ is selected from the groups represented by formula XIII
$(CH_2)_4$—, —CO—, —O—, —SO—, —SO$_2$—, —COHN—, wherein $r = 1-4$,
$R_{12}$ is a hydrogen atom or a carbon amide group, and p is at least equal to 15.

The polyamic acid of formula IX is prepared by reacting an organic dianhydride represented by formula XIV

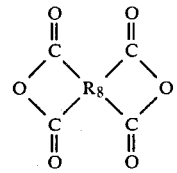

with an equivalent quantity of an organic diamide of formula XV $H_2N$—$R_9$—$NH_2$, wherein $R_8$ and $R_9$ have the above-mentioned meanings.

According to the invention, a polyamic acid is preferably used which has been obtained by reacting pyromellitic acid dianhydride or in particular 3,3',4,4'-benzophenone tetracarboxylic acid dianhydride with an equivalent quantity of 4,4'-diamino diphenyl ether or 4,4'-diaminodiphenyl ether-3-carbonamide.

In the treatment of the polyamic acid of the compound of formula I, an esterification reaction occurs according to the diagram shown in formula XVI

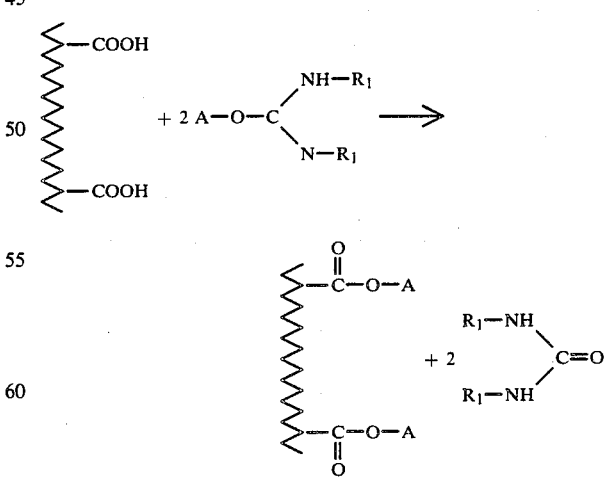

In this diagram the polyamic acid molecule is represented by the vertical sawtooth line to which two —COOH groups are attached, this representation being used for convenience.

The photosensitive polyamic acid derivative according to the invention is preferably a derivative which has been obtained by treating polyamic acid with a compound of formula V $$CH_2=C-C-N-(CH_2)_z-O-C \begin{matrix} NH-R_7 \\ \diagup \\ \diagdown \\ N-R_7 \end{matrix}$$
$$\begin{matrix} | & \| & | \\ R_2 & O & R_6 \end{matrix}$$

wherein
$R_2$ has the above-mentioned meaning,
$R_6$ is a hydrogen atom or a methyl group,
$R_7$ is an isopropyl group or a cyclohexyl group, and
z has a value from 2-4.

In a further embodiment, the invention relates to a photosensitive polyamic acid derivative obtained by treating polyamic acid with a compound of formula VI $$\begin{matrix} O \\ \| \\ CH_3-C-C \\ \| \\ CH_3-C-C \\ \| \\ O \end{matrix} N-(CH_2)_z-O-C \begin{matrix} NH-R_7 \\ \diagup \\ \diagdown \\ N-R_7 \end{matrix}$$

wherein $R_7$ and z have the above-mentioned meanings.

The invention also relates to a method of manufacturing which comprises a polyimide pattern on a substrate, in which the substrate is provided with a layer of the photosensitive polyamic acid derivative, as described hereinbefore, the layer is pattern-wise exposed to light and developed and is then subjected to a thermal treatment, the exposed polyamic acid derivative being converted into polyimide.

According to this method, the photosensitive polyamic acid derivative is first dissolved in a solvent, for example a mixture of N-methylpyrrolidone and methanol. A photoinitiator, for example Michler's ketone, a benzoin ether, 4,4'-bis(diethylamino)benzophenone or thioxanthone is added to the solution. For further details as regards photoinitiators, reference may be made to "Light-sensitive systems" by J. Kosar, John Wiley & Sons, New York, 1965, pp. 143-146 and 160-188.

If a polyamic acid derivative according to formula I is used, in which A is represented by the formula IV A, the solution of the derivative also comprises a bisazide according to formula XX $$N_3-\bigcirc-R_0-\bigcirc-N_3$$

wherein $R_o$ is an organic radical. An example of a suitable bisazide is represented by formula XXI $$N_3-\bigcirc-CH=\bigcirc=CH-\bigcirc-N_3$$
$$\begin{matrix} \| \\ CH_3 \end{matrix}$$

The quantity of the bisazide is, for example, from 1 to 10% calculated on the above polyamic acid derivative.

The solution of the polyamic acid derivative is provided on the substrate in a thin layer, for example, a few micrometers thick.

A suitable deposition process is the so-called spin-coating process in which the substrate is rotated. The solvent is evaporated and the resulting layer is exposed to light pattern-wise, for example, ultraviolet light. For example, the layer may be exposed to light pattern-wise via a mask comprising apertures, for example, linear apertures. In the exposed places the polyamic acid derivative crosslinks.

The pattern-wise exposed layer is developed, the material dissolving in the non-exposed places. Finally, the derivative of polyamic acid is converted into polyimide (imidisation) by a thermal treatment at a temperature of approximately 250°-450° C.

The method according to the invention may be applied to all kinds of substrates, for example, glass plates, silicon wafers, plates of semiconductor material and the like, in which a patterned coating layer, orientation layer in displays, resistance layer, passivating layer, and the like of polyimide is formed on the substrates.

The method is applied advantageously in semiconductor technology in which according to the invention a semiconductor device having a semiconductor body comprising at least one semiconductor circuit element is obtained, for example an integrated circuit, sometimes termed IC or chip, which bears a polyimide pattern.

In Journal of Polymer Science, Polymer Letters Edition, Vol. 19, pp. 629-636 (1981) the substance N,N'-diisopropyl-O-(N''-methylacryloyl-N''-methylaminoethyl)isourea is described. The substance is also referred to as HEDI.

This substance satisfies the formula I
wherein
A is a compound of formula II,
$R_1$ is an isopropyl group,
$R_2$ and $R_3$ both represent a methyl group,
m has the value 2.

The known substance is manufactured by reacting N-hydroxyethyl-N-methylmethacrylamide (HEPA) with N,N'-diisopropylcarbodiimide, in the presence of an organic solvent, for example tetrahydrofuran, and at a comparatively low temperature which during the reaction increases from 0° C. to room temperature. The reaction may be catalysed with CuCl or CuCl₂. The remaining compounds of formula I, in which A is a compound of formula II, can be manufactured analogously.

The compounds of formula I wherein A is a compound of formula III, IV or IV A, are new substances. The invention also relates to these new substances which are represented by formulae VII $$CH_2=C-C-O-(CH_2)_m-O-C \begin{matrix} NH-R_1 \\ \diagup \\ \diagdown \\ N-R_1 \end{matrix}$$
$$\begin{matrix} | & \| \\ R_2 & O \end{matrix}$$

VIII

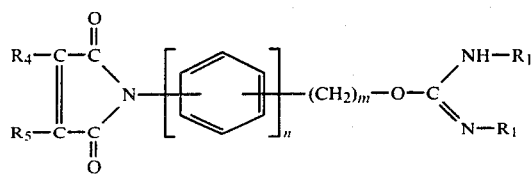

and VIII A

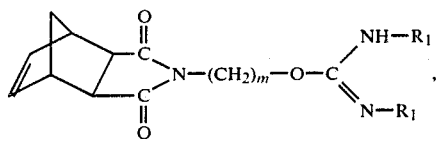

wherein $R_1$, $R_2$, $R_4$, $R_5$, m and n have the meanings given hereinbefore.

The compounds of formula VII are manufactured by reacting a substance of formula XVII

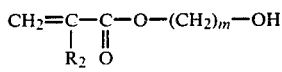

with a compound of formula XVIII $R_1$—N=C=N—$R_1$, wherein $R_1$, $R_2$ and m have the meanings given hereinbefore.

The reaction is carried out in the presence of an organic solvent, for example tetrahydrofuran, at a comparatively low temperature, from 0° C. to room temperature. The reaction is preferably catalysed with CuCl or CuCl$_2$. The reaction medium is preferably buffered with N,N'-diisopropylurea.

The compounds of formula VIII and VIII A are prepared by reacting a substance of formula XIX

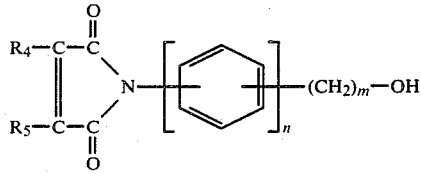

and XIX A

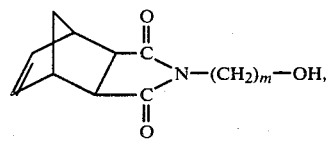

respectively, with a substance of formula XVIII $R_1$—N=C=N—$R_1$, wherein $R_1$, $R_4$, $R_5$, m and n have the meanings given hereinbefore.

As well as the above-mentioned reaction, the reaction is carried out in the presence of a solvent, at a comparatively low temperature, and preferably while using a catalyst, for example, CuCl or CuCl$_2$.

The invention will be described in greater detail by means of the following examples.

Examples

1. Preparation of N,N'-diisopropyl-O-(2-methacryloyloxyethyl)isourea.

A mixture of 13.0 g (0.1 mole) of 2-hydroxyethyl methacrylate and 12.6 g (0.1 mol) of N,N'-diisopropylcarbodiimide is cooled to 0° C. The mixture is stored under N$_2$. 10 mg of CuCl are added to the mixture while stirring. The mixture is stirred at 0° C. for 2 hours and then stored at room temperature for 4 days. A quantity of 2 g of the mixture is dissolved in acetone. 0.25 g of oxalic acid in 5 ml of acetone is added to the solution. The formed precipitate is filtered off, dissolved in acetone and precipitated with ether. This process is repeated a few times. The resulting oxalate of N,N'-diisoproopyl-O-(2-methacryloyloxyethyl)isourea has a melting range from 118°-120° C. Yield 50%.

2. Preparation of N,N'-diisopropyl-O-[2-(2,3-dimethylmaleimide)ethyl]isourea.

20 mg of cuprous chloride are added to a mixture of 10.1 g of N-(2-hydroxyethyl)-2,3-dimethylmaleimide and 11.3 g of N,N'-diisopropylcarbodiimide. The mixture is heated at 70° C. for 7 hours. Yield 13.2 g of N,N'-diisopropyl-O-[2-(2,3-dimethylmaleimide)ethyl]isourea. Boiling range 134°-136° C. at 0.04 mm Hg.

3. Preparation of polyamic acid.

10.0 g (50.0 m.mol) of 4,4'-diaminodiphenyl ether and 160 g of dry, freshly distilled dimethylacetamide are provided in a dry 500 ml flask fitted with a stirrer, a tube filled with calcium chloride and a sluice system for the addition of solid under an inert atmosphere. The contents of the flask are kept under nitrogen during the preparation. Via the sluice system 16.1 g (50 m.mol) of benzophenone tetracarboxylic acid dianhydride are added to the vigorously stirred solution. Stirring is continued until the reaction is completed.

4. Preparation of photosensitive polyamic acid derivative.

26.1 g of polyamic acid in 160 g dimethylacetamide are provided in a dry 2,000 ml flask. 60 g of ethylene glycoldimethyl ether are added. 33.7 g (0.125 mol) of N,N'-diisopropyl-O-(N''-methacryloyl-N''-methylaminoethyl)-isourea dissolved in 125 g of a dry liquid mixture of N-methylpyrrolidone and methanol in the mixing ratio 5:1 are added by means of a dosing pump in a period of time of 2 hours. The solution is diluted with 500 g of a dry liquid mixture of N-methylpyrrolidone and methanol (5:1). By measuring the electrical conductivity of the solution, it was found that the reaction was complete after approximately 8 hours taken from the initial point of time of the addition. The solution is stirred during the whole reaction time.

The diisopropylurea formed during the reaction is removed. This may be done in two manners. According to a first method the resulting solution is partly evaporated, cooled to −15° C. and the crystallized diisopropylurea is removed by filtration.

According to a second method, the solution is concentrated in a film evaporator, diluted with a little N-methylpyrrolidone and methanol (mixing ratio 5:1). The photosensitive polyamic acid derivative is precipitated by the addition of diethyl ether. The derivative is separated, dissolved in N-methylpyrrolidone and methanol and again precipitated by the addition of diethyl ether.

The derivative is separated, dissolved in N-methylpyrrolidone and methanol and again precipitated with diethyl ether.

The derivative thus purified is then dissolved in N-methylpyrrolidone and spun on a silicon wafer after the addition of 2% of weight of Michler's ketone. The resulting film is dried at 80° C. and then exposed to the light of a 500 W high pressure mercury lamp for 60 seconds via a mask which has linear apertures. After developing in a liquid mixture of dimethylacetamide and methanol (2:1), a pattern having sharp edges is formed. The developed film is heated at 150° C. for one hour and at 400° C. for one hour, the exposed polyamic acid derivative being converted into polyimide. The sharp boundaries of the pattern are maintained.

5. Photosensitive polyamic acid derivatives are made in a corresponding manner as described in Example 4 by reaction of the isourea compounds described in Examples 1 and 2 with polyamic acid.

The polyamic acid derivatives dissolved in N-methylpyrrolidone and provided with a photoinitiator. In the polyamic acid derivative derived from the isourea according to Example 1, Michler's ketone is used as a photoinitiator. In the polyamic acid derivative derived from the isourea according to Example 2, thioxanthone is used as a photoinitiator. The solutions are spun onto a silicon wafer. The resulting film is dried, pattern-wise exposed to light and developed in the same manner as described in Example 4. After development, the exposed polyamic acid derivative is converted into polyimide by a thermal treatment. The quality of the pattern is fully maintained.

What is claimed is:

1. A method for producing a semiconductor device having a semiconductor body comprising at least one semiconductor element having a polyimide pattern on a substrate comprising the steps of treating a polyamic acid with a compound of the formula:

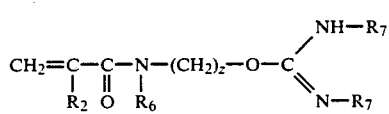

wherein
$R_2$ is hydrogen or methyl,
$R_6$ is hydrogen or methyl,
$R_7$ is isopropyl or cyclohexyl
and z is an integer of 2–4; with a compound of the formula:

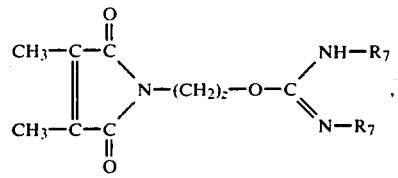

wherein $R_2$ and z are defined above, with a compound of the formula

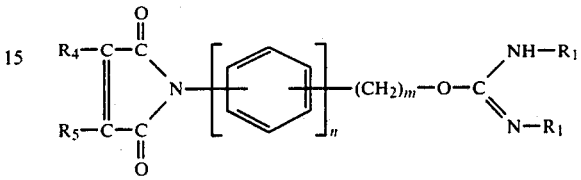

wherein $R_1$ is alkyl of 1–8 carbon atoms, $R_4$ and $R_5$ each independently are hydrogen, methyl or phenyl, n is 0 or 1 and m is an integer of 1–6, or with a compound of the formula

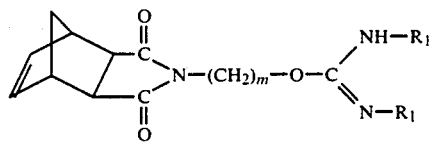

wherein $R_1$ and m are defined as above; applying the resultant photosensitive polyimide acid derivative onto said substrate to form a layer of photosensitive polyamic acid derivative, subjecting said layer to a desired light pattern, developing said exposed layer to thereby form a polyamic acid derivative pattern and the said polyamic derivative pattern is subjected to a thermal treartment thereby converting the polyamic acid derivative to a polyimide.

2. A method of claim 1 wherein polyamic acid is treated with a compound of the formula:

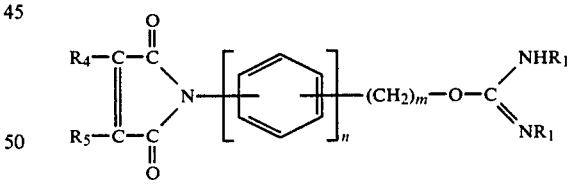

wherein $R_2$ has a meaning given herein before, $R_6$ is a hydrogen atom or a metal group, $R_7$ is an isopropyl group or a cyclohexyl group, and C has a value of 2–4.

3. The method of claim 1 wherein the polyamic acid is treated with a compound of the formula in which $R_7$ is isopropyl or cyclohexyl and C has a value of 2–4.

* * * * *